United States Patent
Shin et al.

(10) Patent No.: US 9,219,501 B2
(45) Date of Patent: Dec. 22, 2015

(54) LDPC ENCODING/DECODING METHOD AND DEVICE USING SAME

(75) Inventors: Dong-Joon Shin, Seoul (KR); Sung-Rae Kim, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 143 days.

(21) Appl. No.: 14/234,714

(22) PCT Filed: Jul. 12, 2012

(86) PCT No.: PCT/KR2012/005522
§ 371 (c)(1),
(2), (4) Date: Jan. 24, 2014

(87) PCT Pub. No.: WO2013/015548
PCT Pub. Date: Jan. 31, 2013

(65) Prior Publication Data
US 2014/0173375 A1 Jun. 19, 2014

(30) Foreign Application Priority Data
Jul. 25, 2011 (KR) .................... 10-2011-0073765

(51) Int. Cl.
*H03M 13/00* (2006.01)
*H03M 13/11* (2006.01)

(52) U.S. Cl.
CPC ........ *H03M 13/1148* (2013.01); *H03M 13/611* (2013.01); *H03M 13/618* (2013.01)

(58) Field of Classification Search
CPC .......... H03M 13/1148; H03M 13/611; H03M 13/618
USPC ....................................... 714/752
See application file for complete search history.

(56) References Cited

U.S. PATENT DOCUMENTS

| | | | | |
|---|---|---|---|---|
| 5,815,514 | A * | 9/1998 | Gray | 714/775 |
| 8,683,302 | B2 * | 3/2014 | Okamura et al. | 714/777 |
| 2003/0074626 | A1 | 4/2003 | Coker et al. | |
| 2009/0013240 | A1 * | 1/2009 | Argon et al. | 714/803 |
| 2010/0050044 | A1 | 2/2010 | Kuri et al. | |
| 2010/0162073 | A1 | 6/2010 | Myung et al. | |
| 2010/0287453 | A1 * | 11/2010 | Balachandran et al. | 714/790 |

FOREIGN PATENT DOCUMENTS

KR 20080001581 A 1/2008

OTHER PUBLICATIONS

Zhengya Zhang, et al; "Design of LDPC Decoders for Low Error Rate Performance", IEEE Transactions on Communications, Nov. 2009, vol. 57, Issue 11, pp. 3258-3268, Nov. 30, 2009.
International Search Report mailed Jan. 25, 2013; PCT/KR2012/005522.

* cited by examiner

*Primary Examiner* — David Ton
(74) *Attorney, Agent, or Firm* — Ladas & Parry LLP

(57) ABSTRACT

Disclosed are an LDPC encoding/decoding method and a device using same. The method includes the steps of: (a) generating an information bit sequence by determining information bits to be encoded from among a group of information bits; (b) generating a modified information bit sequence by inserting a preset error floor prevention bit into at least one preset position in the information bit sequence; (c) generating a parity check bit on the basis of the modified information bit sequence; and (d) performing encoding by using the modified information bit sequence and the parity check bit. According to the disclosed method, performance degradation of LDPC encoding and decoding due to an error floor phenomenon can be prevented.

10 Claims, 14 Drawing Sheets

[A]     [B]

LDPC ENCODING/DECODING METHOD AND DEVICE USING SAME

FIELD OF THE INVENTION

The present invention relates to an LDPC encoding and decoding device.

BACKGROUND OF THE INVENTION

A low density parity check code (LDPC) was first introduced in the early 1960's by Gallanger. This code belongs to a linear block code, and its parity check matrix is formed of a very small number of 1. In the 1990's, e.g., Mackay proved that error performance of a low-density parity check code having very long length of code words was able to approach the Shannon's limit. Accordingly, the application of this code to next generation wireless communication systems has been expanded. For example, the code is employed for Europe digital video broadcasting-satellite (DVB-S) and WiMAX as one of the standards for the portable internet services.

The LDPC has a very large encoding complexity, and thus the LDPC is formed as a repeat accumulate (RA) code, thereby performing the encoding operation easily. As well-known through various documents, an error floor phenomenon is generated in the LDPC. Unlike turbo codes, a tripping set generated by a special structure of sum-product algorithm (SPA) and multiple effects of noise patterns is pointed out to be the main factor in the error floor phenomenon of the LDPC.

Accordingly, there has been a technical means for effectively overcoming the error floor phenomenon which causes performance deterioration of the LDPC, particularly systematic LDPC, of which the usage is increased.

SUMMARY OF THE INVENTION

In view of the above, the present exemplary embodiments suppose an LDPC encoding and decoding method and a device using the same, capable of preventing performance deterioration caused by an error floor phenomenon generated when the encoding and decoding using the LDPC are performed.

In accordance with an aspect of the present exemplary embodiment, there is a provided an LDPC encoding method including: steps of: (a) generating an information bit sequence by determining information bits to be encoded from among a group of information bits; (b) generating a modified information bit sequence by inserting a preset error floor prevention bit into at least one preset position in the information bit sequence; (c) generating a parity check bit on the basis of the modified information bit sequence; and (d) performing encoding by using the modified information bit sequence and the parity check bit.

The information bit sequence may be shifted as the error floor prevention bit is inserted.

The error floor prevention bit may have a value of '0' or '1'.

When the number of information bits to be encoded is finally n, (n-d) information bit sequences are generated in the step (a), and d error floor prevention bits are inserted in the step (b).

The position into which the error floor prevention bit is inserted may be determined on the basis of a position of an information bit having a large number of errors through a simulation.

In accordance with another aspect of the present exemplary embodiment, there is a provided an LDPC encoding method including: steps of: (a) generating an information bit sequence by determining information bits to be encoded from among a group of information bits; (b) generating a modified information bit sequence by inserting a plurality of preset error floor prevention bits into a preset position in the information bit sequence; and (c) performing encoding by using the modified information bit sequence and a parity check bit, wherein the error floor prevention bits are non-sequentially inserted into the information bit sequence.

In accordance with yet another aspect of the present exemplary embodiment, there is a provided an LDPC decoding method including: steps of: positioning error floor prevention bits included in a modified information bit sequence from LDPC encoding data including the modified information bit sequence and a parity check bit; assigning a preset log likelihood ratio (LLR) value to positions corresponding to the error floor prevention bits; and performing decoding by a sum-product algorithm by using the LLR value.

In accordance with yet another aspect of the present exemplary embodiment, there is a provided an LDPC encoding device including: steps of: an information bit sequence generator configured to generate an information bit sequence by determining information bits to be encoded from among a group of information bits; a modified information bit sequence generator configured to generate a modified information bit sequence by inserting a preset error floor prevention bit into at least one preset position in the information bit sequence; a parity check bit generator configured to generate a parity check bit on the basis of the modified information bit sequence; and an encoder configured to perform encoding by using the modified information bit sequence and the parity check bit.

In accordance with yet another aspect of the present exemplary embodiment, there is a provided an LDPC encoding device including: an information bit sequence generator configured to generate an information bit sequence by determining information bits to be encoded from among a group of information bits; a modified information bit sequence generator configured to generate a modified information bit sequence by inserting a plurality of preset error floor prevention bits into a preset position in the information bit sequence; and an encoder configured to perform encoding by using the modified information bit sequence and a parity check bit, wherein the error floor prevention bits are non-sequentially inserted into the information bit sequence.

In accordance with yet another aspect of the present exemplary embodiment, there is a provided an LDPC decoding device including: an LLR assigner configured to position error floor prevention bits included in a modified information bit sequence from LDPC encoding data including the modified information bit sequence and a parity check bit and assign a preset log likelihood ratio (LLR) value to positions corresponding to the error floor prevention bits; and a decoder configured to perform decoding by a sum-product algorithm by using the LLR value.

In accordance with yet another aspect of the present exemplary embodiment, there is a provided an LDPC encoding device including: steps of: a modified information bit sequence generator configured to generate a modified information bit sequence by inserting a preset error floor prevention bit into at least one preset position in an information bit sequence to be encoded; a parity check bit generator configured to generate a parity check bit on the basis of the modified information bit sequence; and an encoder configured to perform encoding by using the modified information bit sequence and the parity check bit.

In accordance with yet another aspect of the present exemplary embodiment, there is a provided an LDPC encoding device including: a modified information bit sequence generator configured to generate a modified information bit sequence by inserting a plurality of preset error floor prevention bits into a preset position in an information bit sequence to be encoded; and an encoder configured to perform encoding by using the modified information bit sequence and a parity check bit, wherein the error floor prevention bits are non-sequentially inserted into the information bit sequence.

In accordance with the aspects of the present invention, it is possible to prevent performance deterioration caused by an error floor phenomenon in an LDPC encoding and decoding.

DETAILED DESCRIPTION OF THE EMBODIMENTS

Figure 1:
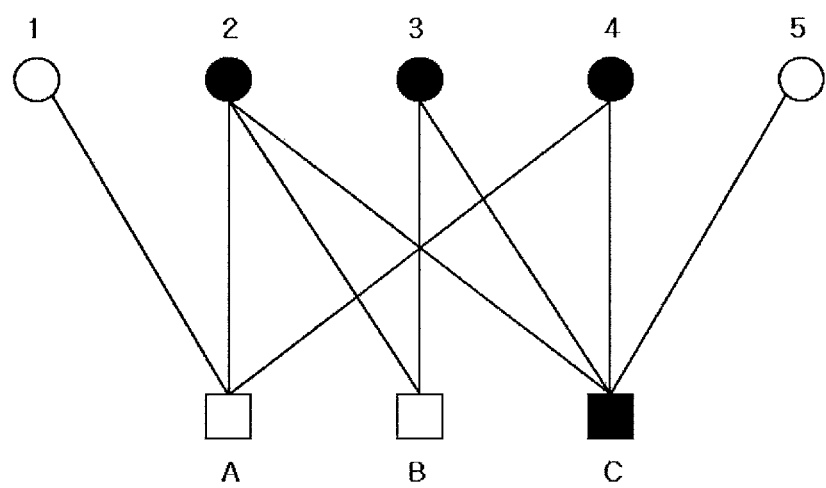
FIG. 1 shows an example of a trapping set which may be generated in a decoding process using an LDPC to which the present invention pertains.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals.

It is noted that the exemplary embodiments of the present invention can be applied to a storage device and receiving and transmitting environments. Problems generated in an environment to which the present invention is applied will first be described before the exemplary embodiments of the present invention are described.

The next generation communication system has been developed in such a form so as to support high speed receipt and transmission of large capacity data. Particularly, the next generation communication system supports and a turbo code and an LDPC having performance that reaches the Shannon's limit to support receipt and transmission of high speed large capacity data. A storage device uses an error correction code of a high code rate to improve integration of information storage. Recently, the turbo code and the LDPC have been applied to the storage device.

The LDPC has a very large encoding complexity, and thus the LDPC is formed as a repeat accumulate (RA) code, thereby performing the encoding operation easily. However, as described above, in the LDPC encoding and decoding operation, an error floor phenomenon generated by an encoding code characteristic and a sum-product decoding method is pointed out to be a problem.

The trapping set is pointed out to be the cause for the error floor phenomenon, but a realizable technique means having a low realization complexity has not been suggested to remove the error floor phenomenon up to this time. Accordingly, the following exemplary embodiments of the present invention suggest an encoding method and a decoding method capable of appropriately blocking the effect of the trapping set to remove the error floor phenomenon of an LDPC, particularly a systematic LDPC.

Specifically, in the LDPC decoding in accordance with the exemplary embodiments of the present invention, a trapping set affecting an error floor that may be generated in a code of the designed LDPC is pre-detected at the encoding. Then, a transmitter (encoder) amends the information bit by inserting a preset value (e.g., 0) into a position of an information bit included in the trapping set to perform encoding. In the future, when the decoding is performed by using a sum-product algorithm, the decoding is performed by assigning a log likelihood ratio (LLR) value to the information bit to thereby improve performance of the error floor phenomenon. Herein, the LLR value has infinite reliability for information bits to which a pre-defined value is assigned by the transmitter. For example, when the pre-defined value is 0, the LLR may be an infinite value. In the case of using a hard-decision value, the pre-defined value of 0 is used regardless of received values.

To that end, in the present invention, an information bit of a turn included in the trapping set is detected from the LDPC. For example, the information bit of the turn included in the trapping set is detected through a simulation. The information bit is amended by inserting a preset value thereinto at the turn, and the decoding is performed by using the sum-product algorithm. In this case, the effect caused by the trapping set may be removed by using a LLR value has infinite reliability or a value assigned by the transmitter regardless of received values.

This encoding method amends an information bit by inserting a preset value into the information bit, and thus a bit having no relation with the information is inserted thereinto. Accordingly, the code rate can be reduced. In the case of the information bits of turns causing the error floor in the quantities of "d," d preset values are inserted. Accordingly, when an original code rate is $$\frac{k}{n},$$

the code rate of the encoding method of the present invention is changed into $$\frac{k-d}{n-d}.$$

If d is much smaller than n, the performance of the error floor can be improved, and when another deterioration is not generated, the code rate can be adjusted by applying the aforementioned algorithm with a code of code rate that is slightly higher than the code rate desired by a user.

Hereinafter, exemplary embodiments of the present invention will be described in detail with reference to the accompanying drawings. The following descriptions will be made based on parts that are necessary to understand the operations of the exemplary embodiments of the present invention, but other parts will be summarized.

FIG. 1 shows an example of a trapping set which may be generated in a decoding process using an LDPC to which the present invention pertains.

First, the trapping set generated in the LDPC decoding operation will be described.

The LDPC is a linear block code and uses a parity check matrix in which the number of "1" is much smaller than the number of "0."

In general, the parity check matrix is defined by using the number of parity bits and the length of code words, and may be employed even in a syndrome test for determining whether there is a bit error in a decoded code word. This parity check matrix can be represented by using a Tanner graph including a check node corresponding to the number of the parity bits and a variable node corresponding to the length of a code word.

An LDPC decoder serves to decode signals received through decoding repeatedly performed by using the sum-product algorithm. In this case, a marginal probability of the Tanner graph is not precisely calculated unlike a maximum-likelihood decoder which is generally used in the turbo code to reduce a decoding complexity. Accordingly, in the sum-product algorithm, the decoding may fail by a structural character of the parity check matrix and a code word having low weight. A set of bit errors that are not amended even though the repeated decoding is completed is referred to as a failure set. When the repeated decoding is successfully completed, the failure set becomes a null set.

When the failure set is not the null set, the repeated decoding is continuously performed until the failure set is the null set, and this process is finished as the repeated frequency reaches a preset number. A set of bit errors whose decoding finally fails may be mostly considered as a sum of small trapping sets.

In brief, after the LDPC decoding is performed, when a set of variable nodes having errors and check nodes (i.e., odd parity conditions) that cannot satisfy even parity conditions is referred to as "T," a trapping set represented as (a, b) in the set T can be defined. That is, a trapping set (a, b) indicates a set having variable nodes in the quantities of "a" and check nodes in the quantities of "b" that are connected by using odd lines among sets T. Accordingly, this trapping set indicates a set causing a performance deterioration on the Tanner graph showing the LDPC matrix since the structure of connecting the variable nodes and the check nodes is not sufficient.

FIG. 1 shows the structure of the LDPC trapping set, in which three black variable nodes 2, 3, and 4 are connected to one black node C by using each line. That is, in the set T, three black variable nodes are connected to one black check node by three lines. Therefore, even if the decoding is performed many times or a high signal-to-noise ratio is maintained, it is difficult to perform a structural amendment on errors formed in the trapping set (i.e., errors simultaneously generated in the black variable nodes 2, 3, and 4) after the decoding is performed through the sum-product algorithm. As a result, this structural limitation is pointed out to be the cause of the error floor phenomenon which deteriorates performance of a bit error rate or a frame error rate.

Hereinafter, a method of detecting factors causing the trapping set from the trapping set shown in FIG. 1 and removing the detected factors will be described. To that end, in the exemplary embodiments of the present invention, main factors causing errors can be detected by counting the number of errors of bits corresponding to positions of each code words after designed LDPCs are decoded. This detecting operation is performed by using simulations, and potential factors which may cause the tripping set can be found by using the detected number of bit errors depending on positions of the code words. This is based on the principle that the bit corresponding to the position at which the most errors are generated has the highest probability.

Figure 2:
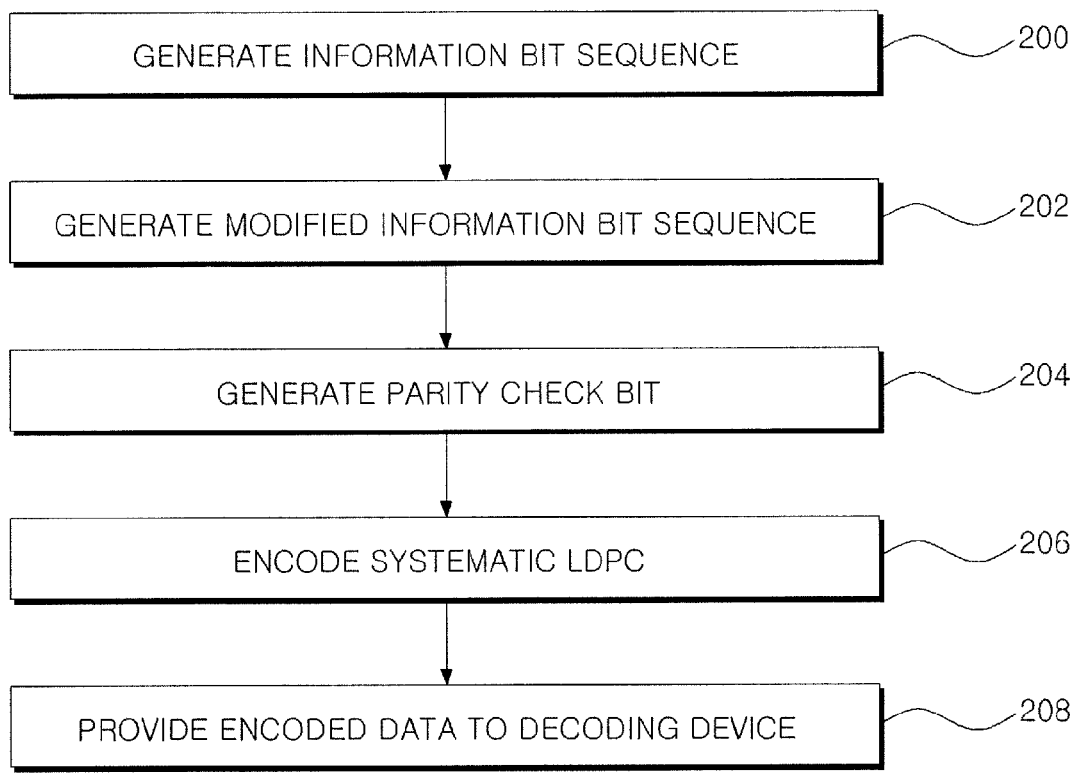
FIG. 2 is a flowchart showing a general process of an LDPC encoding process in accordance with a first exemplary embodiment of the present invention.

FIG. 2 is a flowchart showing a general process of an LDPC encoding process in accordance with a first exemplary embodiment of the present invention.

Referring to FIG. 2, an operation of generating an information bit sequence by determining information bits to be encoded from among a group of information bits is first performed (step 200).

Figure 7:
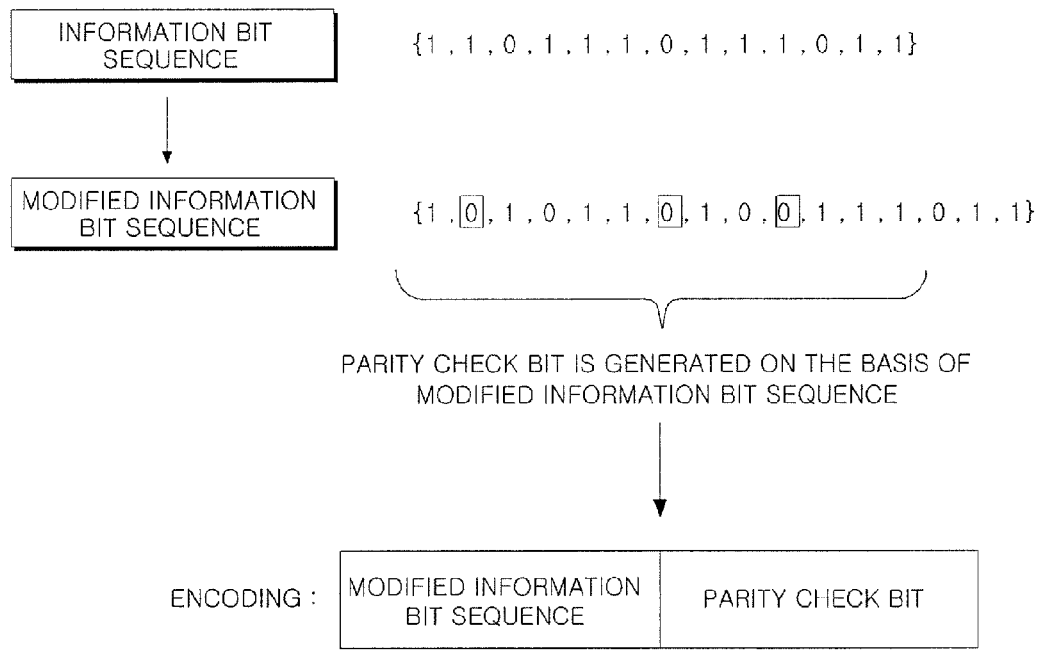
FIG. 7 shows an example for generating a modified information bit sequence in accordance with the first exemplary embodiment of the present invention.

FIG. 7 shows an example for generating a modified information bit sequence in accordance with the first exemplary embodiment of the present invention, and an encoding sequence of the present invention will be described with reference to FIG. 2 and FIG. 7 together. For easy of description, FIG. 7 shows the case that 16 information bits are finally encoded. When an encoding process is actually performed, more information bits may be encoded. For example, 1024 or 2048 bits may be finally encoded at one encoding step.

When the number of bits to be encoded is finally N and the number of preset bits to be inserted to prevent generation of error floor (hereinafter, referred to as error floor prevention bits) is d, (N-d) information bits are determined in the information bit sequence generating step).

In FIG. 7, since the number of bits to be encoded is finally 16 and the number of the error floor prevention bits is 3, 13 information bits are determined. For example, the shown information bit sequence is {1, 1, 0, 1, 1, 1, 0, 1, 1, 1, 0, 1, 1}.

After the information bit sequence is generated, a modified information bit sequence is generated by inserting preset bits into preset positions therein (step 202).

Herein, the preset bits, i.e., the error floor prevention bits may have a value of "0," but the value of the error floor prevention bits may be appropriately adjusted as necessary.

While the error floor prevention bits are inserted into the preset positions in the information bit sequence, then-existing information bits of the positions are shifted. As described above, the positions into which the error floor prevention bits are inserted are determined by using simulations or other analysis method. Alternatively, the positions into which the error floor prevention bits are inserted may be determined by using various analysis methods other than the following method used in the present exemplary embodiment.

Figure 11:
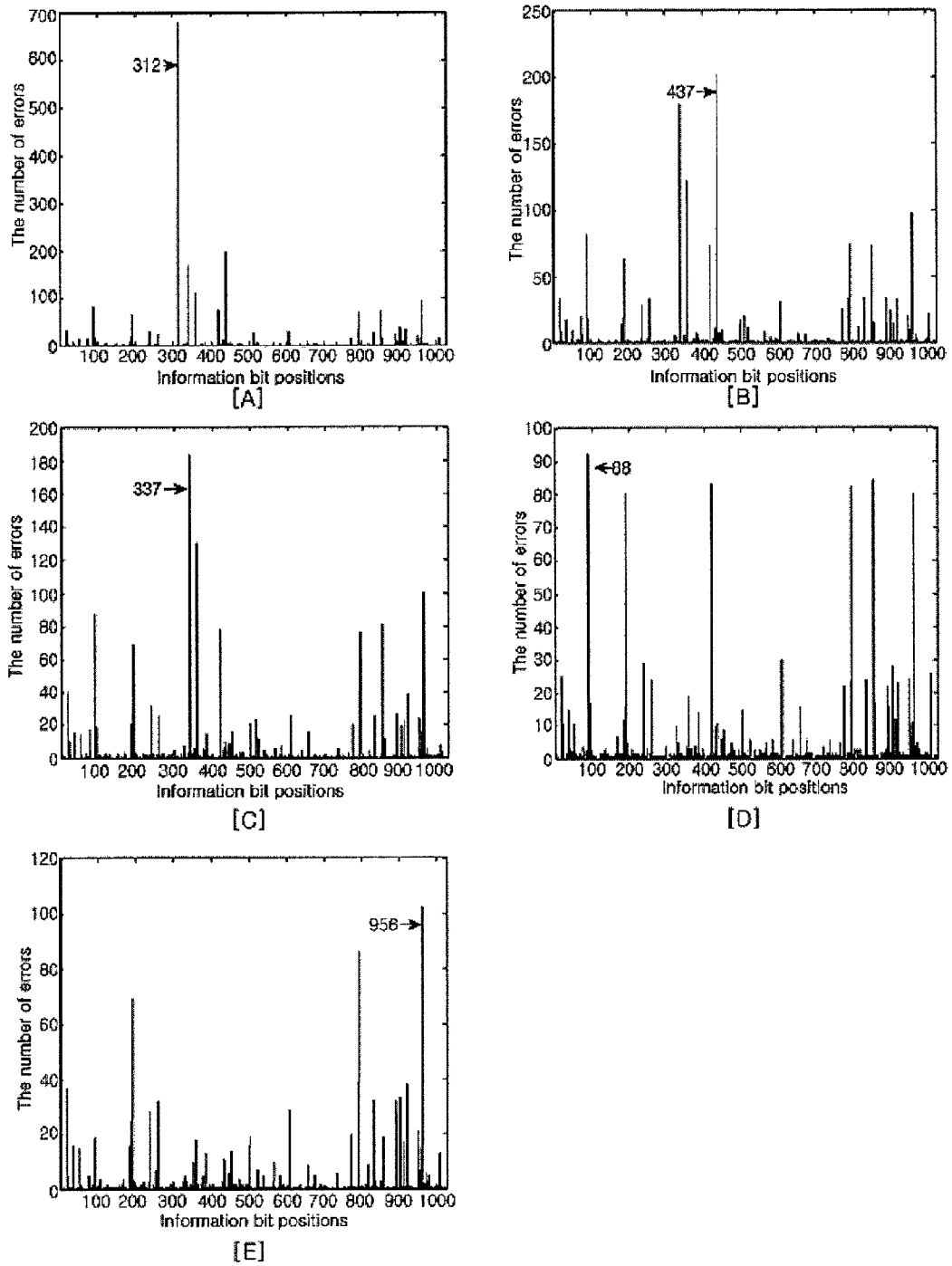
FIG. 11A to FIG. 11E are histograms showing an operation which determines a position into which an error floor prevention bit is inserted according to a simulation in accordance with a second exemplary embodiment of the present invention.

FIG. 11 shows the case that the error floor prevention bits of 0 are respectively inserted into a second position, a seventh position, and a tenth position in the information bit sequence.

While "0" is inserted into the second position, 2nd to 13th bits in the information bit sequence are shifted one by one. While "0" is inserted into the seventh position, 6th to 13th bits in the information bit sequence are shifted one by one. While "0" is inserted into the tenth position, 8th to 13th bits in the information bit sequence are shifted one by one.

The error floor prevention bits are non-sequentially inserted into the information bit sequence. When the error floor prevention bits are non-sequentially inserted into the information bit sequence, the error floor prevention effect is increased. Accordingly, the sequential error floor prevention bits, e.g., the second bit and a third bit are not inserted into the corresponding positions.

As such, the information bits are modified as the error floor prevention bits are inserted and the then-existing bits are correspondingly shifted. This modification of the information bits is a new method, which is not performed in the conventional LDPC encoding process. This is different from shortening in which specific information bits are not transmitted to comply with the length of code words.

After the modified information bit sequence is generated, a parity check bit is generated on the basis of the modified information bit sequence (step 204). In a general LDPC encoding, the parity check bit is generated on the basis of some information bits extracted from the group of information bits. However, in the present invention, the information bits are modified, and then the parity check bit is generated on the basis of the modified information bits.

After the parity check bit is generated, an encoding operation is performed by combining the modified information bit sequence and the parity check bit (step 206). According to the LDPC encoding of the present invention as a systematic LDPC encoding method, the encoding is performed in such a way so as to combine the information bits and the parity check bit.

After the LDPC encoding is completely performed, the encoded data is provided to a decoding device (step 208). In the case that the LDPC encoding and decoding of the present exemplary embodiment is applied to a storage device, the stored encoded data may be provided to a decoding module of the storage device to perform the decoding.

In the case that the LDPC encoding and decoding of the present exemplary embodiment is applied to a communication device, the encoded data is transmitted to a receiver through a communication network according to the aforementioned method, and the receiver decodes the transmitted data.

When the encoded data is provided to the decoding device, the error floor prevention bit included in the modified information bit sequence may be transmitted or the error floor prevention bit may not be transmitted. In the case that the decoding device knows an inserting position of the error floor prevention bit, it is preferable to transmit the encoded data except the error floor prevention bit.

Figure 3:
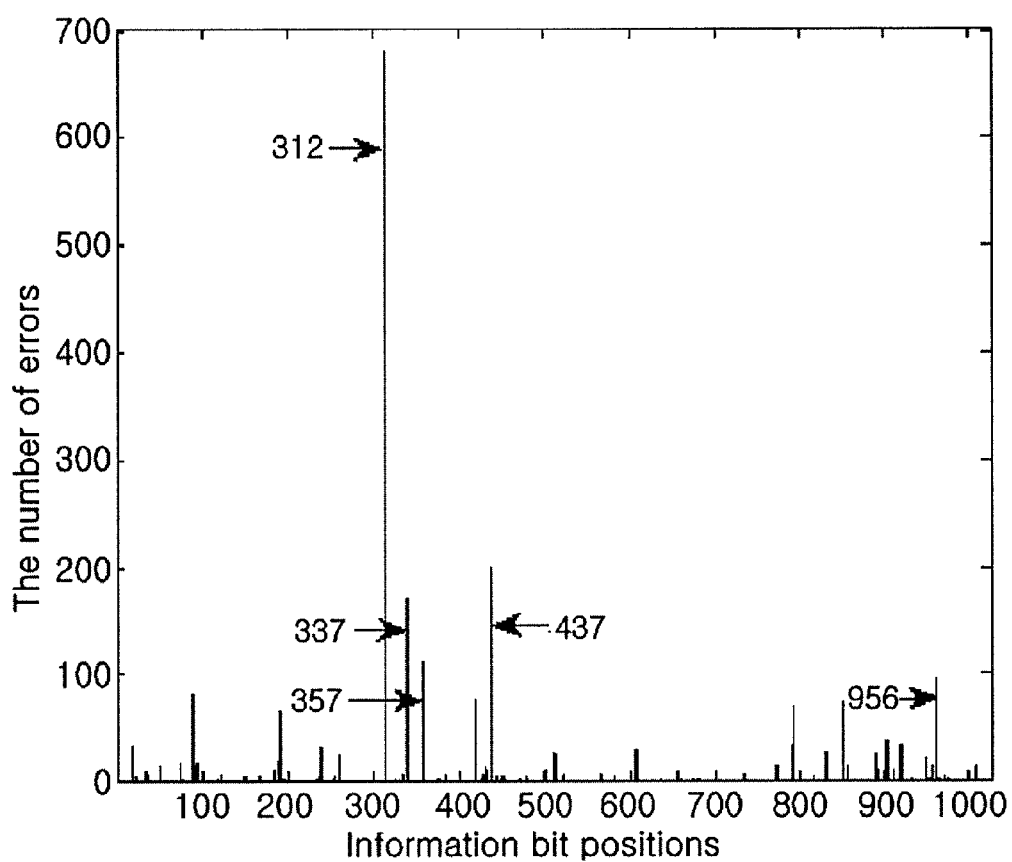
FIG. 3 shows an example of a histogram used for determining a position for inserting an error floor preventing value into an information bit in the present invention.

FIG. 3 shows an example of a histogram used for determining a position for inserting an error floor preventing value into an information bit in the present invention.

A histogram of FIG. 3 is made by recognizing the number of errors according to positions of information bits from a RA code as a kind of a systematic LDPC having a code ward length of 2048 and a code rate of ½. In FIG. 3, the number of errors according to positions of code words by transmitting frames.

In the histogram of FIG. 3, the horizontal axis indicates the positions of the information bits, and the vertical axis indicates the number of errors.

FIG. 3 shows {312, 347, 357, 437, 966} as positions of five information bits having greatest number of errors through simulations, and the information bits of the positions are inferred to have highest possibilities that they are the information bits included in the trapping set.

Accordingly, the preset error floor prevention bit (e.g., 0) is inserted into the corresponding positions, and the then-existing information bits of the positions are shifted to generate the modified information bit sequence.

The simulation for determining a position to which the error floor prevention bit is to be inserted may be performed in an additive white Gaussian noise (AWGN) environment, or may be performed in a binary symmetric channel (BSC) or binary erasure channel (BEC).

The simulation for determining a position to which the error floor prevention bit is to be inserted may be performed by using various methods. In the present invention, the following three methods are suggested. However, it shall be obvious to an ordinary skill in the art that it is possible to perform the simulation by using various modifications based on the suggested methods.

A first simulation serves as a method for simultaneously determining positions of the information bits having the most errors. That is, positions into which the error floor prevention bits are inserted are determined through one-time simulation.

A second simulation serves to determine one position of the information bit at which the most errors are generated. Thereafter, encoding is performed by inserting the error floor prevention bit of 0 into the determined position, and then the second simulation is performed again. The second simulation is repeatedly performed until positions of "d" preset error floor prevention bits are determined.

A third simulation is performed by combining the first simulation and the second simulation to determine positions of the information bits causing the error floor phenomenon by group. The number of the information bits determined is greater than 1 and is smaller than the total number of error floor prevention bits.

The third simulation may be represented as the following equation 1. In the equation 1, "n" indicates the number of the determined groups, and $r_i$ indicates the number of information bits included in the $i^{th}$ group.

$$\sum_{i=1}^{n} r_i = d \quad \text{(Equation 1)}$$
$$r_i > 1,$$
$$i = 1, \ldots, n$$

Figure 4:
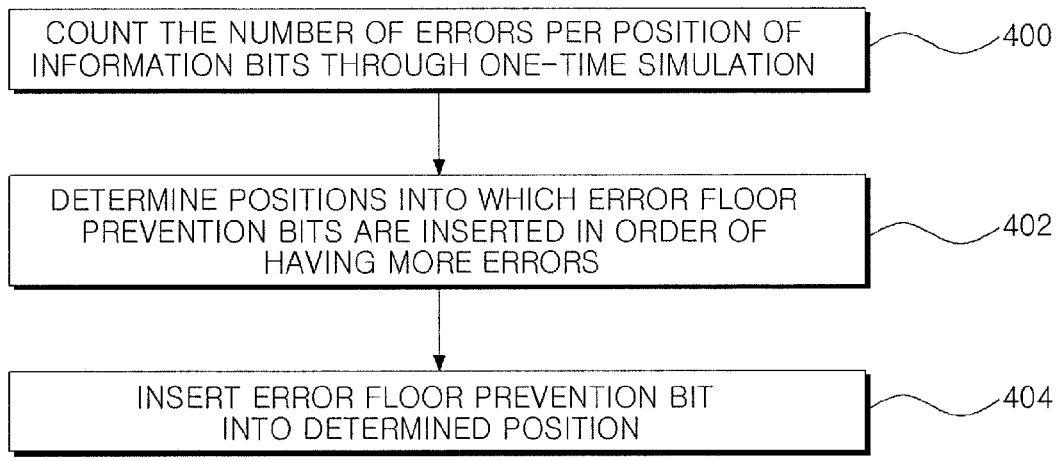
FIG. 4 is a flowchart showing a first simulation method which determines a position into which an error floor prevention bit is inserted in the present invention.

FIG. 4 is a flowchart showing a first simulation method which determines a position into which an error floor prevention bit is inserted in the present invention.

Referring to FIG. 4, the number of errors per position of the information bits is counted through one-time simulation (step 400).

After the number of errors per position of the information bits is counted, positions into which the error floor prevention bits are inserted are determined in order of having more errors (step 402).

After the position determination is completed, the error floor prevention bits are inserted into the positions (step 404).

In other words, the first simulation is performed at one time to determine the positions into which the error floor prevention bits are inserted.

Figure 5:
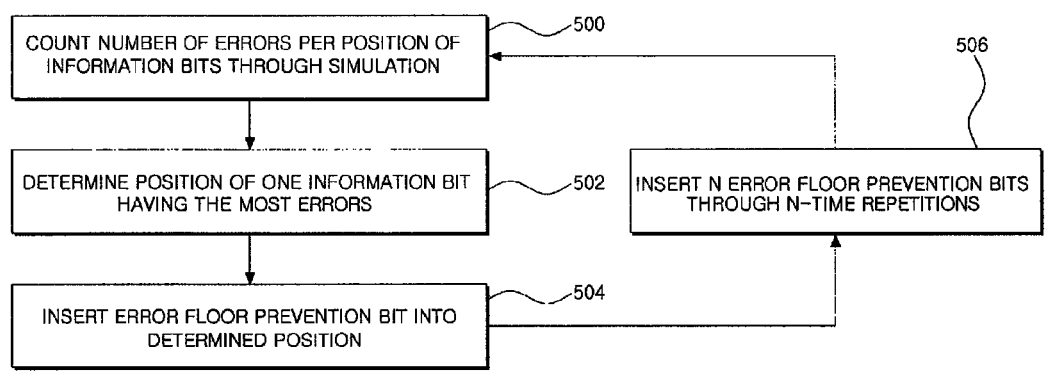
FIG. 5 is a flowchart showing a second simulation method which determines a position into which an error floor prevention bit is inserted in the present invention.

FIG. 5 is a flowchart showing a second simulation method which determines a position into which an error floor prevention bit is inserted in the present invention. Referring to FIG. 5, the number of errors per position of the information bits is counted through the simulation (step 500).

Once the number of errors per position of the information bits is counted, a position of one information bit having the most errors is determined (step 502). After the position of the information bit is determined, the error floor prevention bit is inserted into the position (step 504).

After the error floor prevention bit is inserted into the position, the steps 500 to 504 in which a position of the information having the most errors is determined and the error floor prevention bit is inserted into the position are repeatedly performed (step 506) until the inserting of a preset N of error floor prevention bits is completed.

Figure 6:
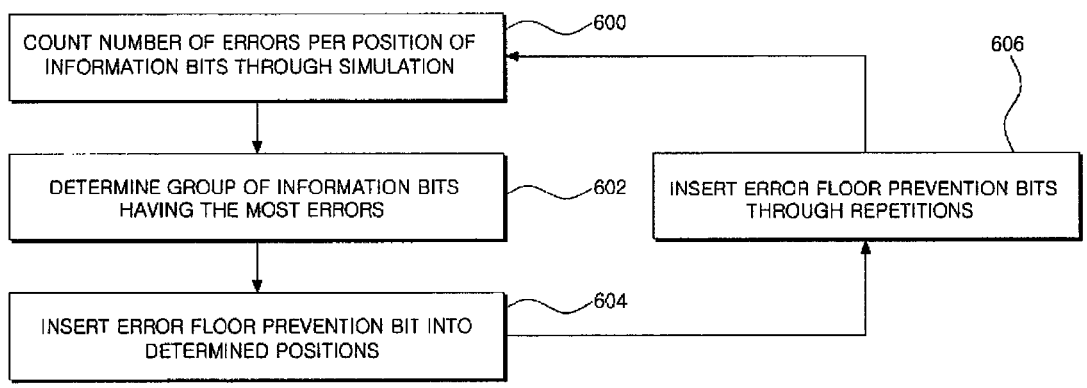
FIG. 6 is a flowchart showing a third simulation method which determines a position into which an error floor prevention bit is inserted in the present invention.

FIG. 6 is a flowchart showing a third simulation method which determines a position into which an error floor prevention bit is inserted in the present invention. Referring to FIG. 6, the number of errors per position of the information bits is counted through the simulation (step 600).

Once the number of errors per position of the information bits is counted, a position group of information bits having many errors is determined (step 602). The number of the information bits included in one group is preset, Once the position group is determined, the error floor prevention bits are inserted into the positions of the group (step 604).

The steps 600 to 604 in which a preset number of information bit positions are determined and the error floor prevention bits are inserted into the determined positions are repeatedly performed until the preset number of error floor prevention bits are inserted into the positions.

Figure 8:
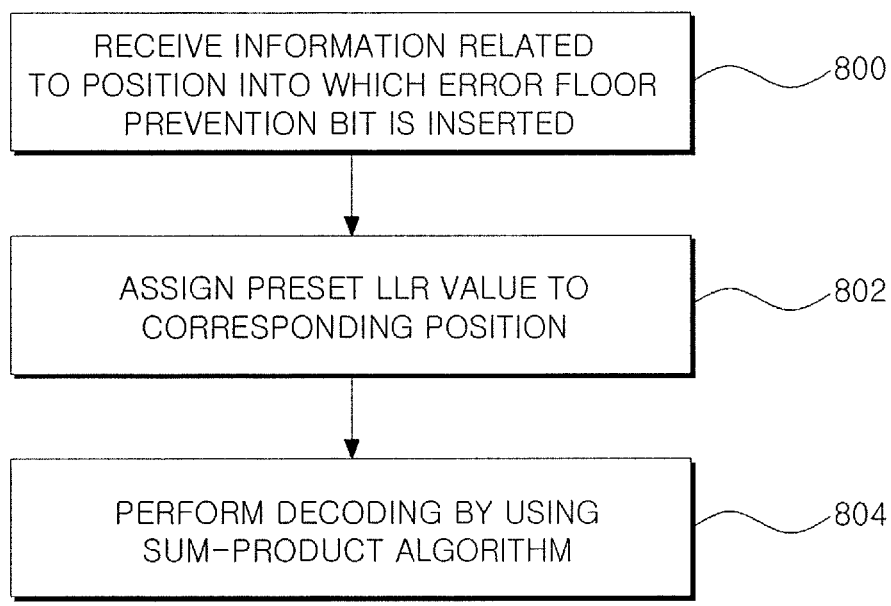
FIG. 8 is a flowchart showing an LDPC decoding method in accordance with the first exemplary embodiment of the present invention.

FIG. 8 is a flowchart showing an LDPC decoding method in accordance with the first exemplary embodiment of the present invention.

Referring to FIG. 8, information related to positions into which the error floor prevention bits are inserted is provided (step 800). For example, the positions into which the error floor prevention bits are inserted may be stored as a lookup table in advance in a decoding device. In the case of a storage device including an encoding module and a decoding module together as a single device, it is preferable to store the positions into which the error floor prevention bits are inserted as the lookup table.

For another example, the positions into which the error floor prevention bits are inserted may be included in header information to be provided to the decoding device when encoded data is transmitted from a transmitter to a receiver.

Once the positions into which the error floor prevention bits are inserted are recognized, a log likelihood ratio (LLR) value having specific reliability is assigned to the positions into which the error floor prevention bits are inserted (step 802). For example, in the case that "0" is assigned as the error floor prevention bit, the LLR value may have positive infinity. In the case that "1" is assigned as the error floor prevention bit, the LLR value may have negative infinity.

After the LLR value is assigned, a decoding operation using a sum-product algorithm is performed by employing the LLR value (step 804).

Hereinafter, the sum-product algorithm used in the decoding operation of the present invention will be described in detail.

Figure 9:
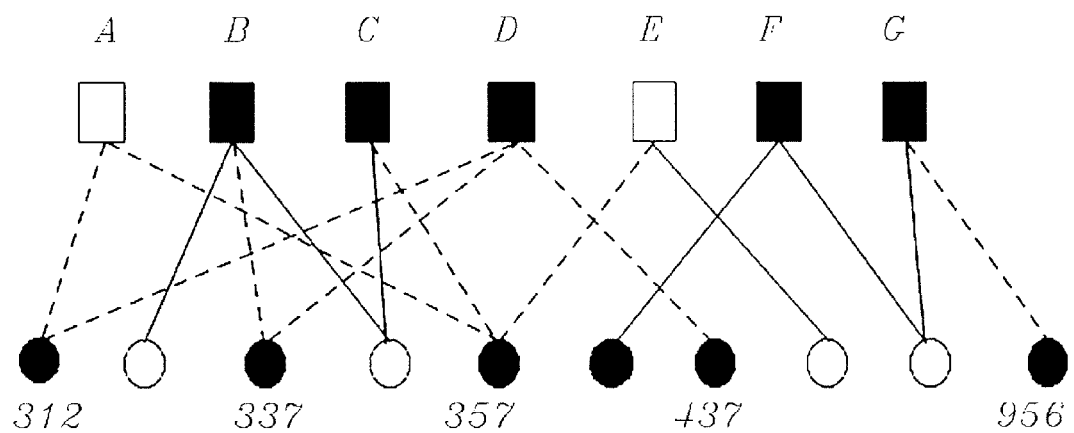
FIG. 9 and FIG. 10 are Tanner graphs respectively showing generation situation of a trapping set which does not correct a decoding error and a result of removing a trapping set by using the LDPC decoding method in accordance with the present exemplary embodiment.
Figure 10:
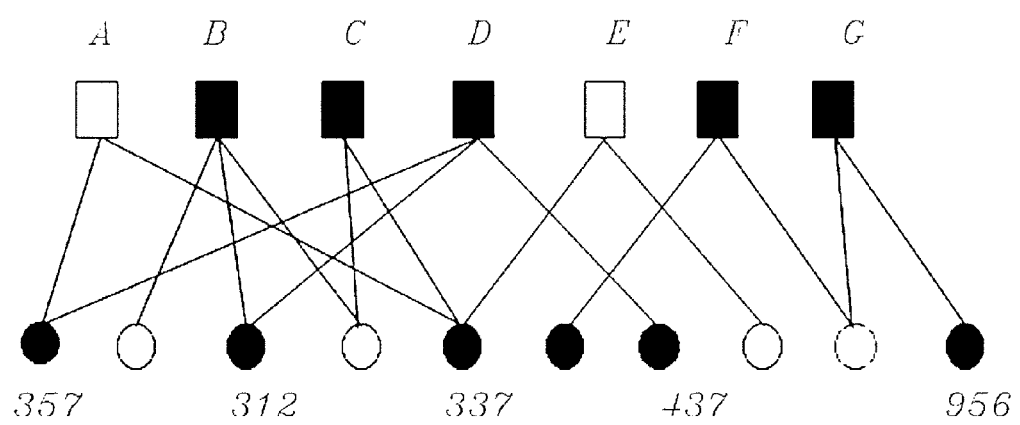

FIG. 9 and FIG. 10 are Tanner graphs respectively showing generation situation of a trapping set which does not correct a decoding error and a result of removing a trapping set by using the LDPC decoding method in accordance with the present exemplary embodiment.

FIG. 9 illustrates an effect of the trapping set, and it is noted that the bits 312, 337, 357, and 437 are included in the trapping set. These bits correspond to nodes in which it is difficult to correct errors in the decoding operation since they form an odd number of connection lines when being connected to the check nodes. Accordingly, in accordance with the first one of the suggested methods for determining information bit positions, four information bit positions are determined in the encoding operation, and the error floor prevention bit of "0" is inserted into the positions to transmit them. Then, in the decoding operation, LLR values are assigned to the four bit positions to perform the sum-product algorithm. The performance result of the sum-product algorithm is illustrated in FIG. 10.

In FIG. 9, the dotted line indicates the result of removing the effect of the trapping set by the assignment of the error floor prevention bits of "0"

In FIG. 9, the trapping set effect is removed by disconnecting a part of the connection between the check node and the variable node. In other words, messages transmitted to the check nodes B, C, and D have no effect thereon by the methods for determining information bit positions through the connection lines indicated by the dotted lines, and thus the effect of the trapping set related to the check nodes B, C, and D disappears.

The above result of removing the trapping set in FIG. 10 can be deducted through the calculation of check nodes in the following sum-product algorithm by performing the encoding with "0" by the transmitter and using the LLR value at the bit positions by the receiver. The sum-product algorithm may be repeatedly performed on the variable nodes and the check nodes for the LDPC decoding. The detailed algorithm will be described.

First, a message is initialized to a line connected to a variable node. The initialization for performing the sum-product algorithm on each code word bit is performed by using the following equation 2.

$$L(x) = \frac{P(x=0)}{P(x=1)}, \qquad \text{(Equation 2)}$$

(the likelihood of $x$)

$$L(x \mid y) = \frac{p(x=0 \mid y)}{p(x=1 \mid y)},$$

(the conditional likelihood of $x$ given $y$)

$$\log L(x), \log L(x \mid y),$$

(the log likelihood and the conditional log likelihood)

$$\log L(x \mid y_1, \ldots, y_l) = \sum_{i=1}^{l} \log L(x \mid y_i)$$

-continued $$P(x_i = 0 \mid y_i) = \frac{L(x_i \mid y_i)}{1 + L(x_i \mid y_i)},$$

$$\tanh x = \frac{e^x - e^{-x}}{e^x + e^{-x}}$$

In equation 2, p(x=0) and p(x=1) respectively indicate possibilities in which a code word bit x becomes "0" and "1."

First, the variable node transmits the initialized message by using a line (EDGE) connected on the Tanner graph, and then the check node connected to each variable node updates the message by using the sum-product algorithm. Thereafter, the updated message is returned to the variable node by using the connected line, and then the variable node updates the message value by using the returned message. This operation is repeatedly performed 30 to 50 times to perform a decoding algorithm of a low density parity check matrix. Accordingly, the message obtained when the operation is repeatedly performed "I" times is updated by the following equation 3.

Second, the $I^{th}$ variable node message is updated.

The variable node message is updated by the equation 3.

$$m_{vc}^{(l)} = \begin{cases} m_v := L(x \mid y) & \text{if } l = 0 \\ m_v + \sum_{c' \in N(v) \backslash c} m_{c'v}^{(l-1)}, & \text{if } l \geq 1 \end{cases} \quad \text{(Equation 3)}$$

Herein, $m_v$ is an initial message included in the variable node through the message initialization, and $m_{vc}^{(l)}$ is the message to be transmitted to the connected check node after being updated through the equation 3 by the variable node when the operation is repeatedly performed "I" times. Further, N(v) is all check nodes connected to the corresponding variable nodes, and c'∈N(v)\c indicates that only the message transmitted through the connected line (EDGE) from the remaining check nodes other than the check node to be transmitted when the variable node updates the message by using the connected check node is considered.

Third, the $I^{th}$ variable node message is updated.

The variable node message is updated by the following equation 4.

$$m_{cv}^{(l)} = \log \frac{1 + \prod_{v' \in N(c) \backslash v} \tanh\left(\frac{m_{v'c}^{(l)}}{2}\right)}{1 - \prod_{v' \in N(c) \backslash v} \tanh\left(\frac{m_{v'c}^{(l)}}{2}\right)} \quad \text{(Equation 4)}$$

Herein, $m_{vc}^{(l)}$ is the message transmitted from the variable node to the check node when the operation is repeatedly performed "I" times, $m_{cv}^{(o)}$ is the message to be transmitted before being updated by the check node. Fourth, a min-sum minimization algorithm is performed.

The calculation of check node has a numerically analytical instability and much calculation amount due to its non-linear computation. Accordingly, the calculation of check node can be replaced with the min-sum algorithm such as the following equation 5 which hardly causes the performance deterioration.

$$\gamma(x) := (\text{sgn}(x), -\ln \tanh(|x|/2)) \quad \text{(Equation 5)}$$

$$m_{cv}^{(l)} = \gamma^{-1}\left(\sum_{v' \in V_c \backslash v} \gamma\left(m_{v'c}^{(l-1)}\right)\right) \approx \text{sgn}(m_1)\text{sgn}(m_2)\min(|m_1|, |m_2|)$$

Herein, sgn(x) is a function for determining a code value of a variable x as +1 and −1, and min( ) is a function for determining a smallest value as a result. Further, |m| is an absolute value of the message. As a result, it is possible to facilitate calculating of the check node message by using message codes and the absolute value through the equation 5.

FIG. 11A to FIG. 11E are histograms showing an operation which determines a position into which an error floor prevention bit is inserted according to a simulation in accordance with a second exemplary embodiment of the present invention.

The histograms of a total of five steps for determining the position into which the error floor prevention bit is inserted are sequentially shown in order of FIG. 11A to FIG. 11E.

First, a position of one information bit having the most errors is determined through an initial simulation (i.e. simulation that is first performed). Accordingly, under this assumption, an initially determined information bit is a 312th bit, which is shown in FIG. 11A.

Next, the $312^{th}$ bit is encoded by using "0," and then a position of one information bit having the most errors is determined through another simulation (i.e., simulation that is second performed). In this case, a $437^{th}$ which is shown in FIG. 11B. As a result, two bits are determined.

After the $312^{th}$ bit and the $437^{th}$ bit are determined and are encoded by using "0," a position of one information bit having the most errors is determined through yet another simulation (i.e., simulation that is third performed). In this case, the determined information bit is a $337^{th}$ bit, which is shown in FIG. 11C. As a result, three bits are determined.

Next, by repeating the same steps, a $88^{th}$ bit and a $956^{th}$ bit are determined. The bits are respectively shown in FIG. 11D and FIG. 11E. As As such, as recognized through the aforementioned method, the second simulation for determining an information bit position, unlike the first simulation, determines each one bit in different trapping sets to remove the trapping set effect instead of simultaneously determining all the bits connected to one trapping set. Accordingly, the second simulation method is more efficient than the second simulation method in the case of removing the error floor phenomenon. This is because when the second simulation method is employed, the possibility of removing the trapping set effect is relatively more increased by the reconstructed information bits.

Figure 12:
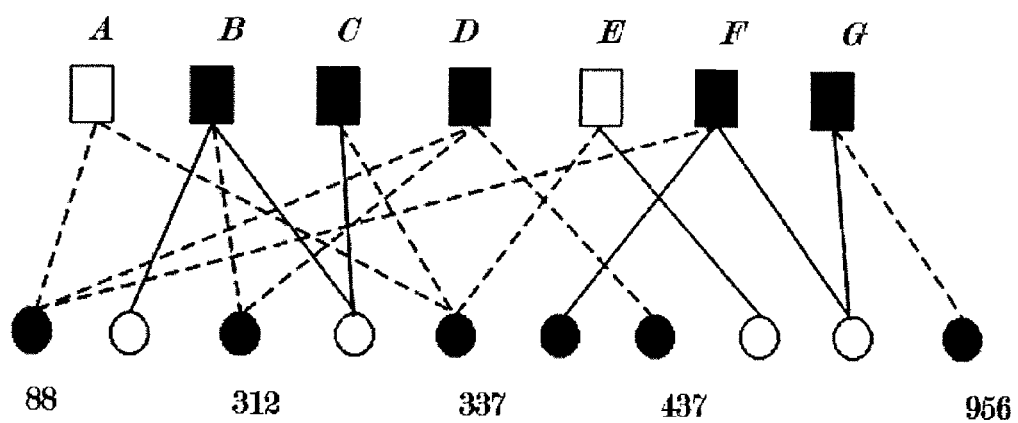
FIG. 12 is a Tanner graph showing a result of removing a trapping set through the simulation in accordance with the second exemplary embodiment.

FIG. 12 is a Tanner graph showing a result of removing a trapping set through the simulation in accordance with the second exemplary embodiment.

The bit positions {312, 437, 337, 88, 956} are determined through the second simulation, and the message transmitted through lines connected to the check nodes B, C, D, G, and F by dotted lines has no effect on the calculation of check nodes since the connection lines are disconnected. Accordingly, the effect of the trapping set connected to the check nodes B, C, D, G, and F disappears.

Figure 13:
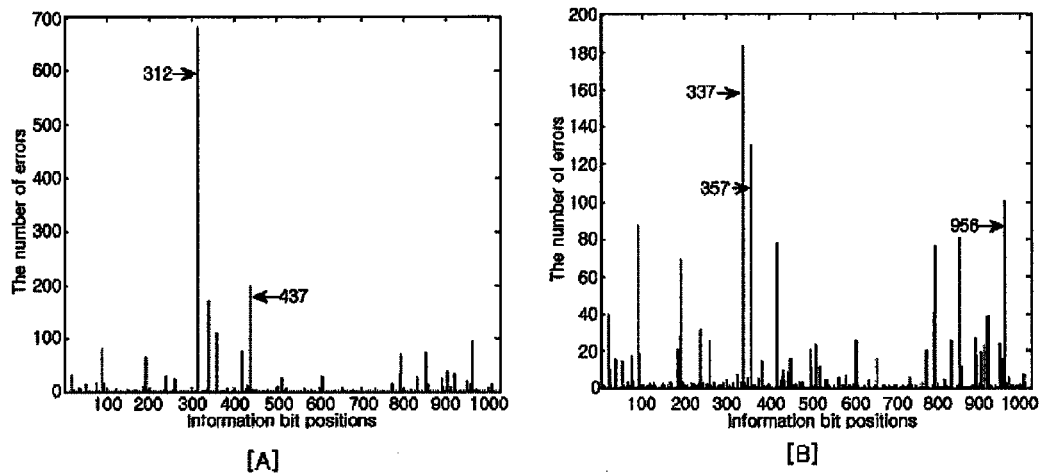
FIG. 13A and FIG. 13B are histograms showing an operation which determines a position into which an error floor prevention bit is inserted according to a simulation in accordance with a third exemplary embodiment of the present invention.

FIG. 13A and FIG. 13B are histograms showing an operation which determines a position into which an error floor prevention bit is inserted according to a simulation in accordance with a third exemplary embodiment of the present invention.

The histograms of a total of five steps for determining the position into which the error floor prevention bit is inserted are sequentially shown in order of FIG. 13A and FIG. 13B.

First, an information bit group having the most errors is determined through an initial simulation (i.e. simulation that is first performed). In this initial simulation, a $312^{th}$ bit and a $437^{th}$ bit are determined. The two bits are shown in FIG. 13A.

After the 312th bit and the 437th bit are encoded by using "0," an information bit group having the most errors is determined through another simulation. In another simulation, a $337^{th}$ bit, a $357^{th}$ bit, and a 956 bit are determined. The bits are shown in FIG. 13B.

Figure 14:
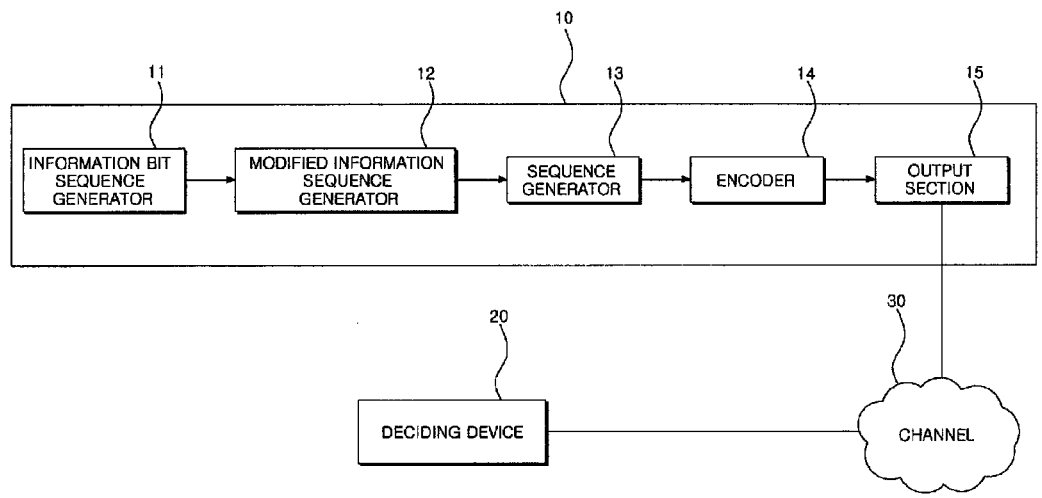
FIG. 14 shows LDPC encoding and decoding devices in accordance with an exemplary embodiment of the present invention.

FIG. 14 shows LDPC encoding and decoding devices in accordance with an exemplary embodiment of the present invention. In FIG. 14, the LDPC encoding and decoding devices (an encoding device 10 and a decoding device 20) capable of communicating with each other through a communication channel 30. Operations and functions of the constituent elements shown in FIG. 14 correspond to the encoding method described with reference to FIG. 2 and the decoding method described with reference to FIG. 8, and thus the functions of the constituent elements will be described in brief.

The LDPC encoding device 10 of the present invention may include an information bit sequence generator 11, a modified information bit sequence generator 12, a parity generator 13, an encoder 14 and an output section 15.

The information bit sequence generator 12 serves to determine an information bit to be encoded from among a group of information bits to generate an information bit sequence. When the number of the preset error floor prevention bit is d and the number of information bits is n, (n-d) information bits are determined to generate an information bit sequence.

The modified information bit sequence generator 12 serves to generate a modified information bit sequence by inserting an error floor prevention bit having a preset value into a preset position of the information bit sequence, and the then-existing information bit is shifted according to the inserting of the error floor prevention bit.

The parity generator 13 serves to generate a parity bit on the basis of the modified information bit sequence, and the encoder 14 performs encoding by combining the modified information bit sequence and the parity bit.

The output section 15 may serve to store encoded data in a specific space, transmit it to a specific medium, and/or transfer it to the decoding device 20 through the communication channel 30 or any communication means.

The decoding device 20 serves to decode the encoded data, and receive information related to the position into which the error floor prevention bit is inserted. As described above, the position into which the error floor prevention bit is inserted may be provided through a lookup table or header information.

Further, the decoding device 20 performs the decoding by the sum-product algorithm by using an LLR value in which, e.g., positive infinity is applied to a corresponding position.

The encoding device and the decoding device may be realized by a processor and a memory. Further, software codes for controlling the hardwares may be used.

Figure 15:
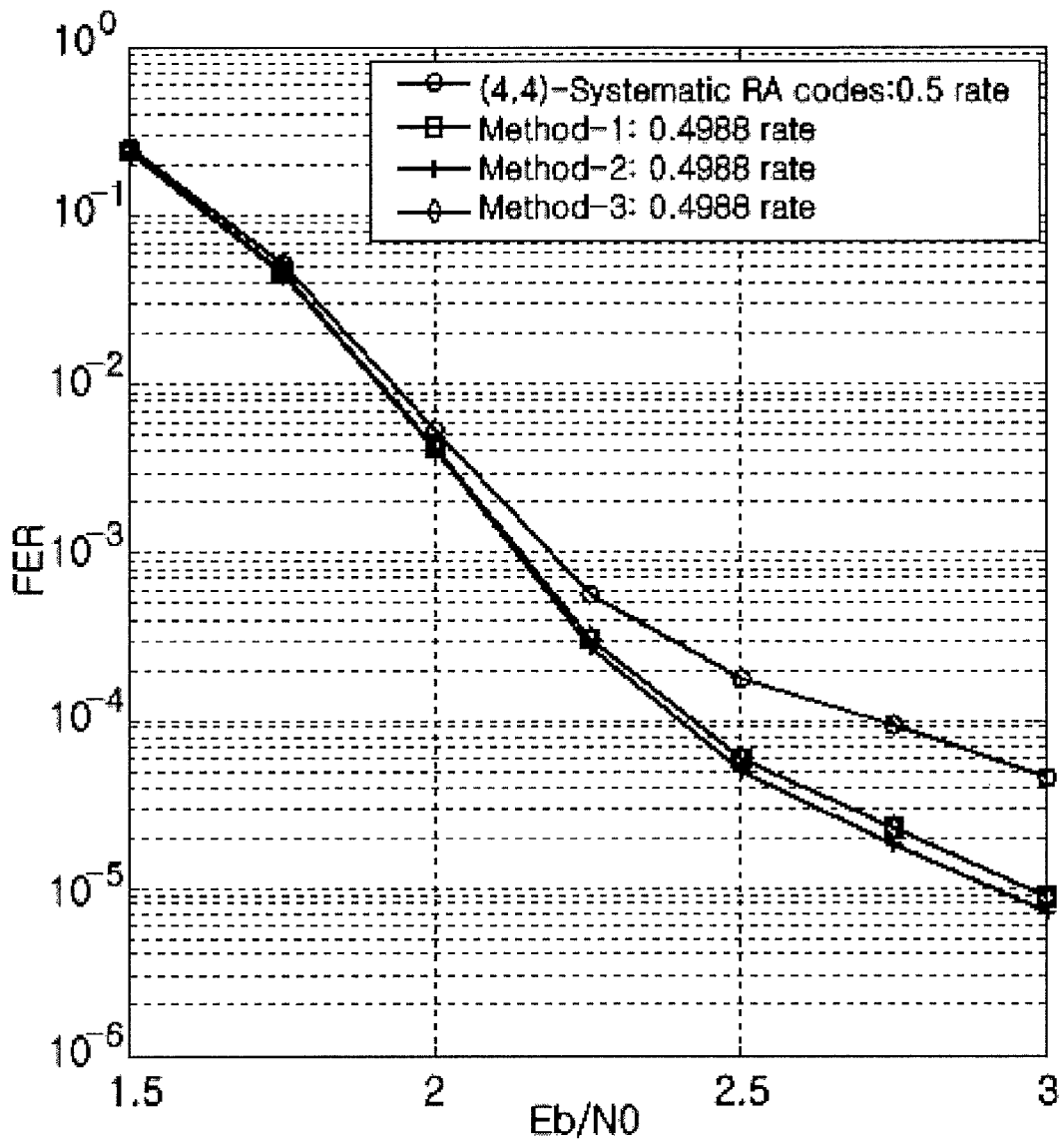
FIG. 15 is a graph showing comparison of frame error rates (FERs) between a general systematic LDPC and the LDPC in accordance with the exemplary embodiments of the present invention.

FIG. 15 is a graph showing comparison of frame error rates (FERs) between a general systematic LDPC and the LDPC in accordance with the exemplary embodiments of the present invention.

Referring to FIG. 15, it is seen that the error floor phenomenon is significantly removed through the encoding performed by inserting the error floor prevention bit in accordance with the present invention as compared with a general systematic LDPC.

In the test shown in FIG. 15, a modified information bit sequence having a length of 1024 bits and RA codes was used. It is seen that better performance is obtained by determining the position into which the error floor prevention bit is inserted through the second simulation method.

In accordance with the exemplary embodiments of the present invention, by suppressing generation of code word information bits related to a trapping set, it is possible to minimize an error floor phenomenon generated in encoding and decoding techniques using an LDPC, improve performance of a bit error rate of an application level, and effectively suppress occurrence of an actual error floor phenomenon generated in a storage device and the like even under an environment of a relatively low signal-to-noise ratio. Accordingly, in accordance with the exemplary embodiments of the present invention, it is possible to effectively block a latency caused by using hybrid automatic request (HARQ) since a desired bit error rate performance in an application field such as a real-time multimedia service which has a fatal weakness to the latency.

Meanwhile, the exemplary embodiments of the present invention can be realized by using a computer-readable storage medium and a computer-readable code. For example, a switch setting value can be calculated in an outside computer according to a first counting value and a second counting value to be applied thereto. Herein, the computer-readable storage medium includes all kinds of storage mediums capable of storing data that can be read by a computer system.

An example of the computer-readable storage medium includes a ROM, a RAM, a CD-ROM, a magnetic tape, a floppy disk, an optical data storing device or the like, and may be realized in the form of carrier wave (e.g., transmission through the Internet. Further, computer-readable codes that are dispersed to a computer system connected thereto through a network may be stored and executed in the computer-readable storage medium In addition, functional programs, codes, and code segments for realizing the exemplary embodiments of the present invention may be easily inferred by programmers in the art.

Hitherto, the present invention has been described through various exemplary embodiments. The drawings and detailed description are only examples of the present invention, serve only for describing the present invention and by no means limit or restrict the spirit and scope of the present invention. Thus, any person of ordinary skill in the art shall understand that a large number of permutations and other equivalent embodiments are possible. Accordingly, it will be appreciated by any person of ordinary skill in the art that a large number of modifications, permutations and additions are possible within the principles and spirit of the invention, the scope of which shall be defined by the appended claims and their equivalents.

What is claimed is:

1. An LDPC encoding method comprising: steps of:
   (a) generating an information bit sequence by determining information bits to be encoded from among a group of information bits;
   (b) generating a modified information bit sequence by inserting a preset error floor prevention bit into at least one preset position in the information bit sequence;
   (c) generating a parity check bit on the basis of the modified information bit sequence; and (d) performing encoding by using the modified information bit sequence and the parity check bit.

2. The LDPC encoding method of claim 1, wherein the information bit sequence is shifted as the error floor prevention bit is inserted.

3. The LDPC encoding method of claim 1, wherein the error floor prevention bit has a value of '0' or '1'.

4. The LDPC encoding method of claim 1, wherein when the number of information bits to be encoded is finally n, (n-d) information bit sequences are generated in the step (a), and d error floor prevention bits are inserted in the step (b).

5. An LDPC encoding method comprising: steps of:
   (a) generating an information bit sequence by determining information bits to be encoded from among a group of information bits;
   (b) generating a modified information bit sequence by inserting a plurality of preset error floor prevention bits into a preset position in the information bit sequence; and
   (c) performing encoding by using the modified information bit sequence and a parity check bit,
   wherein the error floor prevention bits are non-sequentially inserted into the information bit sequence.

6. The LDPC encoding method of claim 5, wherein the parity check bit is generated on the basis of the modified information bit sequence.

7. The LDPC encoding method of claim 5, wherein the error floor prevention bit has a value of '0' or '1'.

8. The LDPC encoding method of claim 5, wherein when the number of information bits to be encoded is finally n, (n-d) information bit sequences are generated in the step (a), and d error floor prevention bits are inserted in the step (b).

9. An LDPC decoding method comprising: steps of:
   positioning error floor prevention bits included in a modified information bit sequence from LDPC encoding data including the modified information bit sequence and a parity check bit;
   assigning a preset log likelihood ratio (LLR) value to positions corresponding to the error floor prevention bits; and
   performing decoding by a sum-product algorithm by using the LLR value.

10. The LDPC decoding method of claim 9, wherein the preset LLR value is positive infinity or positive infinity.

* * * * *